(12) United States Patent
Liu et al.

(10) Patent No.: US 6,734,511 B2
(45) Date of Patent: May 11, 2004

(54) AUTO SENSOR FUNCTION CHIP

(75) Inventors: Jun-Xiu Liu, Taichung (TW);
Ming-Shuo Yen, Hsinchu (TW);
Chiu-Bian Kuo, Yunlin (TW);
Chun-Hsiung Peng, Taoyuan (TW)

(73) Assignee: Taiwan Semiconductor Manufacturing Co. Ltd., Hsin chu (TW)

( * ) Notice: Subject to any disclaimer, the term of this patent is extended or adjusted under 35 U.S.C. 154(b) by 68 days.

(21) Appl. No.: 10/001,113

(22) Filed: Nov. 2, 2001

(65) Prior Publication Data

US 2003/0085437 A1 May 8, 2003

(51) Int. Cl.[7] .............................................. H01L 27/06
(52) U.S. Cl. .................. 257/414; 257/421; 438/48; 438/49
(58) Field of Search .................. 257/414–427, 257/467, 774; 439/68–70, 82; 438/48–49, 629

(56) References Cited

U.S. PATENT DOCUMENTS 4,950,173 A * 8/1990 Minemura et al. ............ 439/82
5,540,737 A * 7/1996 Fenn .......................... 607/101
6,205,660 B1 * 3/2001 Fjelstad et al. ............... 29/885

FOREIGN PATENT DOCUMENTS

CN          1080791 A  *  6/1992  ............ H02M/1/08

OTHER PUBLICATIONS

Quach et al, "A Highly Integrated Commercial GaAs Transceiver MMIC for 2.45 GHz ISM Applications", Proceedings 1997 Wireless Communications Conference (1994), pp. 141–146.*

* cited by examiner

Primary Examiner—Nathan J. Flynn
Assistant Examiner—Johannes P Mondt
(74) Attorney, Agent, or Firm—Tung & Associates

(57) ABSTRACT

A method and system for implementing a variable function circuit within a single semiconductor chip. The semiconductor chip can be configured as a single circuit that provides varying functions according to extrinsic conditions. The single circuit can be permitted to be switched between a particular function and a different particular function, thereby promoting a decreased complexity in circuit design and a decrease in physical dimensions necessary to manufacture the semiconductor chip. Additionally, at least one portion of the semiconductor chip may be designated to the particular function and at least one other portion of the semiconductor chip to the different particular function. The semiconductor chip may thus act as a function switch.

18 Claims, 4 Drawing Sheets

AUTO SENSOR FUNCTION CHIP

TECHNICAL FIELD

The present invention relates generally to semiconductor devices and manufacturing methods and systems thereof. More specifically, the present invention relates to semiconductor chips, which are based on via/contact configurations. The present invention also relates to semiconductor chips having variable functions.

BACKGROUND OF THE INVENTION

Modern electronic devices utilize semiconductor chips, commonly referred to as "integrated circuits" which incorporate numerous electronic elements. These chips can be mounted on substrates, which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis.

Alternatively, in a so-called "hybrid circuit" one or more chips can be mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The size of the chip and substrate assembly is a major concern. The size of each such assembly influences the size of the overall electronic device. More compact assemblies, with smaller distances between chips provide smaller signal transmission delays and hence permit faster operation of the devise.

First level interconnection structures connecting a chip to a substrate ordinarily can be subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off.

As the chip and the substrate ordinarily can be formed from different materials having different coefficients of thermal expansion, the chip and substrate ordinarily expand and contract by different amounts. This causes the electrical contacts on the chip to move relative to the electrical contact pads on the substrate as the temperature of the chip and substrate changes. This relative movement deforms the electrical interconnections between the chip and substrate and places them under mechanical stress. These stresses can be applied repeatedly with repeated operation of the device, and can cause breakage of the electrical interconnections. Thermal cycling stresses may occur even where the chip and substrate can be formed from like materials having similar coefficients of thermal expansion, because the temperature of the chip may increase more rapidly than the temperature of the substrate when power is first applied to the chip.

During the process of semiconductor fabrication, alternating layers of a nonconducting material (dielectric), such as silicon dioxide, and of a conductor, such as aluminum tungsten, can be formed over the semiconductor substrate. Devices, such as transistors or diodes, among others, can be formed at and within the semiconductor substrate. Contact between the lowest layer of conductive material and a region of a device, at and within the semiconductor device (e.g., a source or drain) is generally made through an opening in a first dielectric layer. The opening can then be filled with a conductive material to form a contact that couples the region of the device to the lowest conductive layer. In addition, a vertical opening, known as a via, is filled with conductive material to connect circuits on various layers of a device to one another and to the semiconductor substrate. This conductive material is known as an interconnect.

Openings (i.e., vias and contacts) are often formed using a mask and photolithography. For example, a photosensitive film, such as photoresist, is applied to a surface of the semiconductor substrate. A mask with a desired pattern is used during photolithography to help transfer the desired pattern onto the substrate or a surface on the substrate. The photoresist is then exposed to light through the mask and then developed. The exposed surface of the substrate and photoresist can be removed so that the desired pattern is now on the substrate's surface.

In the manufacture of semiconductor devices, metal vias and contacts thus can be deposited into via openings and contact holes on semi-conducting wafers that have been preprocessed. Semiconductor devices are thus formed connected to each other by the metal vias and contacts to form an integrated circuit. In particular, aluminum, aluminum alloys, tungsten and tungsten alloys are frequently used for deposition into the via openings and contact holes on the semi-conducting substrate. These deposition processes can be carried out by a physical vapor deposition (or sputtering) or a chemical vapor deposition technique.

The cost of the chip and substrate assembly is also a major concern. All these concerns, taken together, present a formidable engineering challenge. Various attempts have been made heretofore to provide primary interconnection structures and methods to meet these concerns, but none of these is truly satisfactory in every respect.

Vias and contacts currently are utilized as a link between multi-layer conductors and devices thereof, regardless of preparation by wet or dry etching, dual damascene, or filling by tungsten, aluminum or copper, and so forth. Physically, vias and contacts have a common characteristic of immovability at fixed positions, but do not generally provide any functions other than that of linking. Consequently, if a semiconductor chip is required to provide various functions by extrinsic environmental conditions, it may be necessary to attach one or sensors to the semiconductor chip, which in turn increases associated costs, volume and additionally, the complexity of design.

Based on the foregoing, the present inventors have discovered that a need exists for a method and system which would result in a shrinkage in total dimension, a cost reduction, and a decreased complexity of circuit design, while providing a unique variable function feature for a single semiconductor chip and associated circuit thereof. The present invention thus meets this need through the implementation of a function switch, along with associated methods and systems thereof.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor chip and associated circuitry thereof.

It is another aspect of the present invention to provide a semiconductor chip based on a via/contact configuration.

It is yet another aspect of the present invention to provide a method and system for implementing a variable function circuit within a single semiconductor chip.

It is yet another aspect of the present invention to provide a function switch.

It is still another aspect of the present invention to provide an auto sensor function chip.

The above and other aspects of the present invention can be achieved as is now described. A method and system for implementing a variable function circuit within a single semiconductor chip is disclosed. The semiconductor chip can be configured as a single circuit that provides varying functions according to extrinsic conditions. The single circuit can be permitted to be switched between a particular function and a different particular function, thereby promoting a decreased complexity in circuit design and a decrease in physical dimensions necessary to manufacture the semiconductor chip. Additionally, at least one portion of the semiconductor chip may be designated to the particular function and at least one other portion of the semiconductor chip to the different particular function.

Thus, different design functions can be configured for the semiconductor chip, such that these functions depend on extrinsic conditions, such as temperature, magnetic field, and so forth, for a single chip. Each function may be turned on or off utilizing open and short properties of via/contact. The semiconductor chip is configured with via/contact properties. In other words, the via/contact properties of the semiconductor chip permit the chip to act as a function switch. In order to realize this type of semiconductor chip, a filler of via/contact can be provided, which is based on physically sensitive materials, such as, for example, SMA (Shape Memory Alloy). Additionally, two group deformations may be designated according to varying extrinsic conditions and may be connected to particular function based on desired extrinsic conditions.

BRIEF DESCRIPTION OF THE DRAWINGS

The accompanying figures, in which like reference numerals refer to identical or functionally-similar elements throughout the separate views and which are incorporated in and from part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

The present invention thus describes a general method for implementing a variable function circuit within a single semiconductor chip. Such a semiconductor chip can be configured as a single circuit that provides varying functions according to extrinsic conditions. The single circuit can be permitted to be switched between a particular function and a different particular function, thereby promoting a decreased complexity in circuit design and a decrease in physical dimensions necessary to manufacture the semiconductor chip. Additionally, at least one portion of the semiconductor chip may be designated to the particular function and at least one other portion of the semiconductor chip to the different particular function.

Different design functions can be configured for the semiconductor chip, such that these functions depend on extrinsic conditions, such as temperature, magnetic field, and so forth, for a single chip. Each function may be turned on or off utilizing open and short properties of via/contact. The semiconductor chip is configured with via/contact properties. In other words, the via/contact properties of the semiconductor chip permit the chip to act as a function switch. In order to realize this type of semiconductor chip, a filler of via/contact can be provided, which is based on physically sensitive materials, such as, for example, SMA (Shape Memory Alloy). Additionally, two group deformations may be designated according to varying extrinsic conditions and may be connected to particular function based on desired extrinsic conditions.

Figure 1:
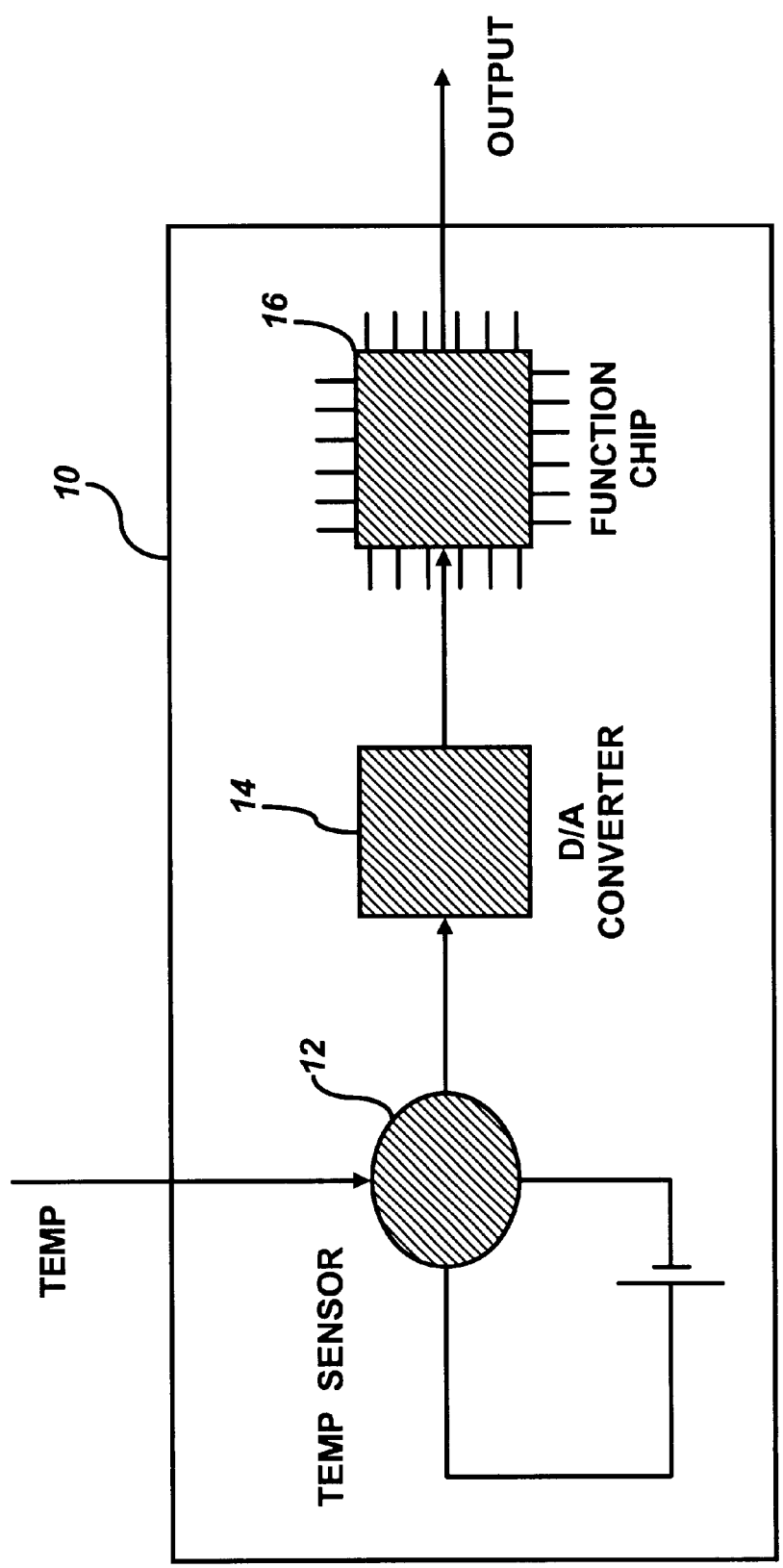
FIG. 1 illustrates a prior art temperature sensor system.

In order to appreciate the problem solved by the invention described herein, FIG. 1 illustrates a prior art temperature sensor system 10. The ability to provide a particular function, such as, for example, sensing temperature, requires additional circuitry. Thus, in FIG. 1, a temperature sensor 12 is connected to a digital/analog converter, which in turn is linked to function chip 16 (i.e., a semiconductor chip), which provides a particular output.

Figure 2:
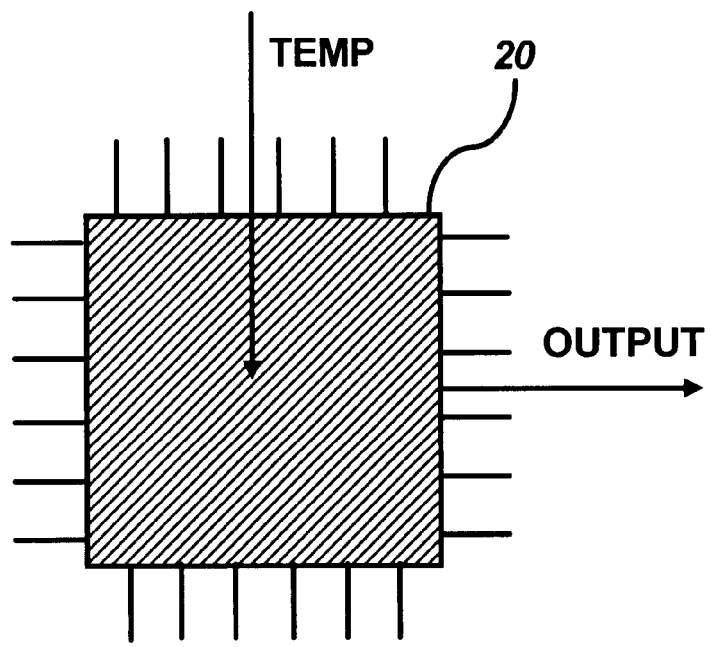
FIG. 2 depicts a semiconductor chip, in accordance with a preferred embodiment of the present invention.

FIG. 2 depicts a semiconductor chip 20, in accordance with a preferred embodiment of the present invention. In the example illustrated in FIG. 2, a temperature sensing function is integrated on a single semiconductor chip, rather than relying on the much more complex design described with reference to FIG. 1.

Figure 3:
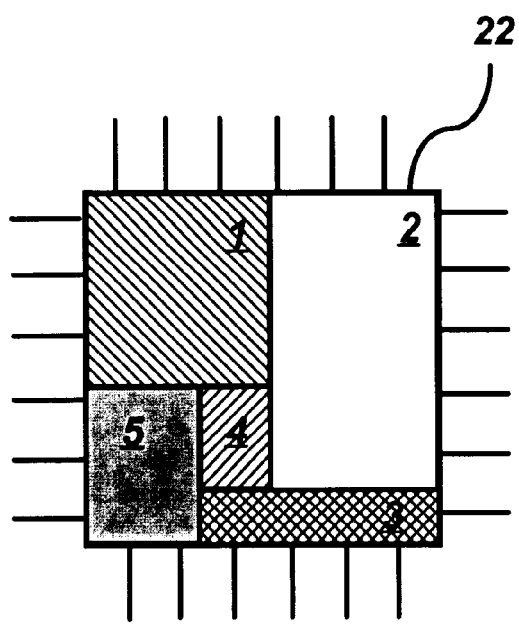
FIG. 3 illustrates an alternative semiconductor chip, in accordance with an alternative preferred embodiment of the present invention.

FIG. 3 depicts an alternative semiconductor chip 22, in accordance with an alternative preferred embodiment of the present invention. Semiconductor chip 22 of FIG. 3 is generally analogous to semiconductor chip 20 of FIG. 2. In the configuration illustrated in FIG. 3, variable functions may be designed and implemented upon one semiconductor chip 22. Thus, semiconductor chip comprises a first function 1, a second function 2, a third function 3, a fourth function 4 and a fifth function 5. Additional functions not illustrated in FIG. 3 may be added to semiconductor chip 22, depending on particular design requirements. Each function depends on an extrinsic condition.

The via/contact utilized in association with semiconductor chip 22 acts as a function switch, which replaces a sensor device, such as temperature sensor 12 of FIG. 1. Physically sensitive materials, such as, for example, SMA (Shape Memory Alloy) may be utilized for filler during the fabrication of semiconductor chip 22. Deformation may be set versus an associated function. By implementing a semiconductor chip in this manner, the total dimensions may be shrunk, while reducing associated costs and decreasing circuit design complexity. FIG. 2 and FIG. 3 thus illustrate an auto sensor function chip.

Figure 4:
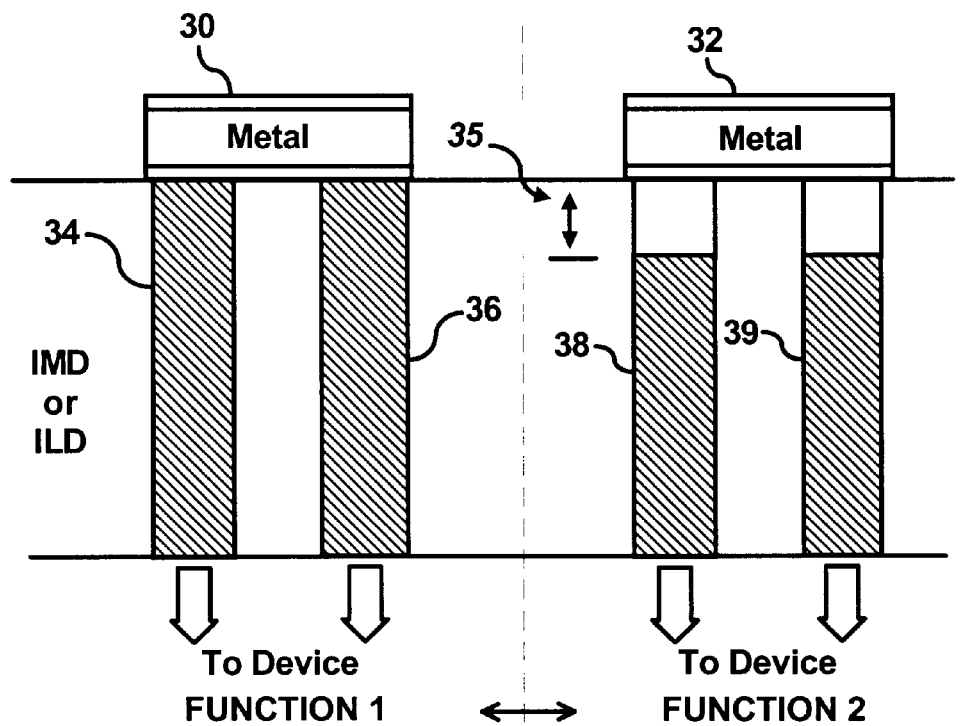
FIG. 4 illustrates a first function at a first time in association with an auto sensor function chip, in accordance with a preferred embodiment of the present invention.

FIG. 4 illustrates a first function at a first time in association with an auto sensor function chip, in accordance with a preferred embodiment of the present invention. The present invention can provide the same function (e.g., temperature sensing) as illustrated in FIG. 1 or another function (e.g., magnetic field sensing) because its via/contact filler can be configured from physically sensitive material. For example, SMA may be utilized as the filler. Proper deformation at different temperatures must be maintained so as to enable the filler to connect to devices requiring particular temperatures. The fillers can be connected to devices that are required to operate at certain temperatures. FIG. 4 thus illustrates a layer configuration that may be utilized to construct semiconductor chip 20 or 22 of FIGS. 2 and 3 respectively. FIG. 4 illustrates the presence of an IMD or ILD. An inter-metal dielectric (IMD) layer can be formed between two metal layers for isolation. An interlevel dielectric (ILD) layer may also be utilized in association with semiconductor chips 20 and 22. Filler structures 34, 36, 38 and 39 are generally positioned below metal layers 30 and 32. A deformation 35 is also indicated in FIG. 4 with respect to filler structures 38 and 39. Such filler structures thus comprise fillers, which may be configured from physically sensitive material, such as SMA.

Figure 5:
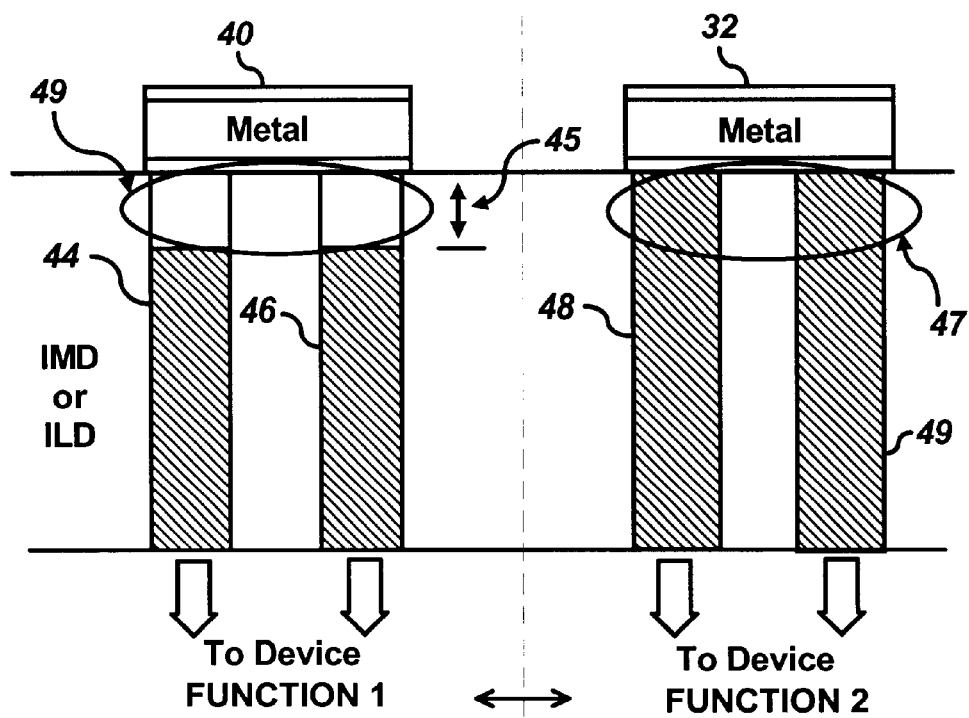
FIG. 5 depicts a second function at a second time in association with an auto sensor function chip, in accordance with a preferred embodiment of the present invention.

FIG. 5 depicts a second function at a second time in association with an auto sensor function chip, in accordance with a preferred embodiment of the present invention. Although different reference numerals are indicated in FIG. 5, it can be appreciated that such reference numerals may refer to identical or different elements than the elements illustrated in FIG. 4. FIG. 5 and FIG. 4 should be interpreted together in order to understand the variable function feature of semiconductor chips 20 and 22 of FIGS. 2 and 3. Thus, as depicted in FIG. 5, the presence of an IMD or ILD is indicated. Filler structures 44, 45, 48 and 49 are generally positioned below metal layers 30 and 32.

A deformation 45 is also indicated in FIG. 5 with respect to filler structures 44 and 46. Such filler structures thus comprise fillers, which may be configured from physically sensitive material, such as SMA. The contact filler may be deformed, as indicated at reference numeral 49 due to different temperature settings. The difference between the area illustrated by reference numerals 47 and 49 illustrates this deformation. Thus, the configuration illustrated in FIG. 4 and FIG. 5 permits an associated semiconductor chip, such, as for example, semiconductor chips 20 or 22 of FIGS. 2 and 3 to act as a function switch. While temperature sensing may comprise one particular function, those skilled in the art can appreciate that other functions may be also be implemented in accordance with one or more embodiments of the present invention. FIG. 4 and FIG. 5 together represent an example of an ON-OFF switch.

Figure 6:
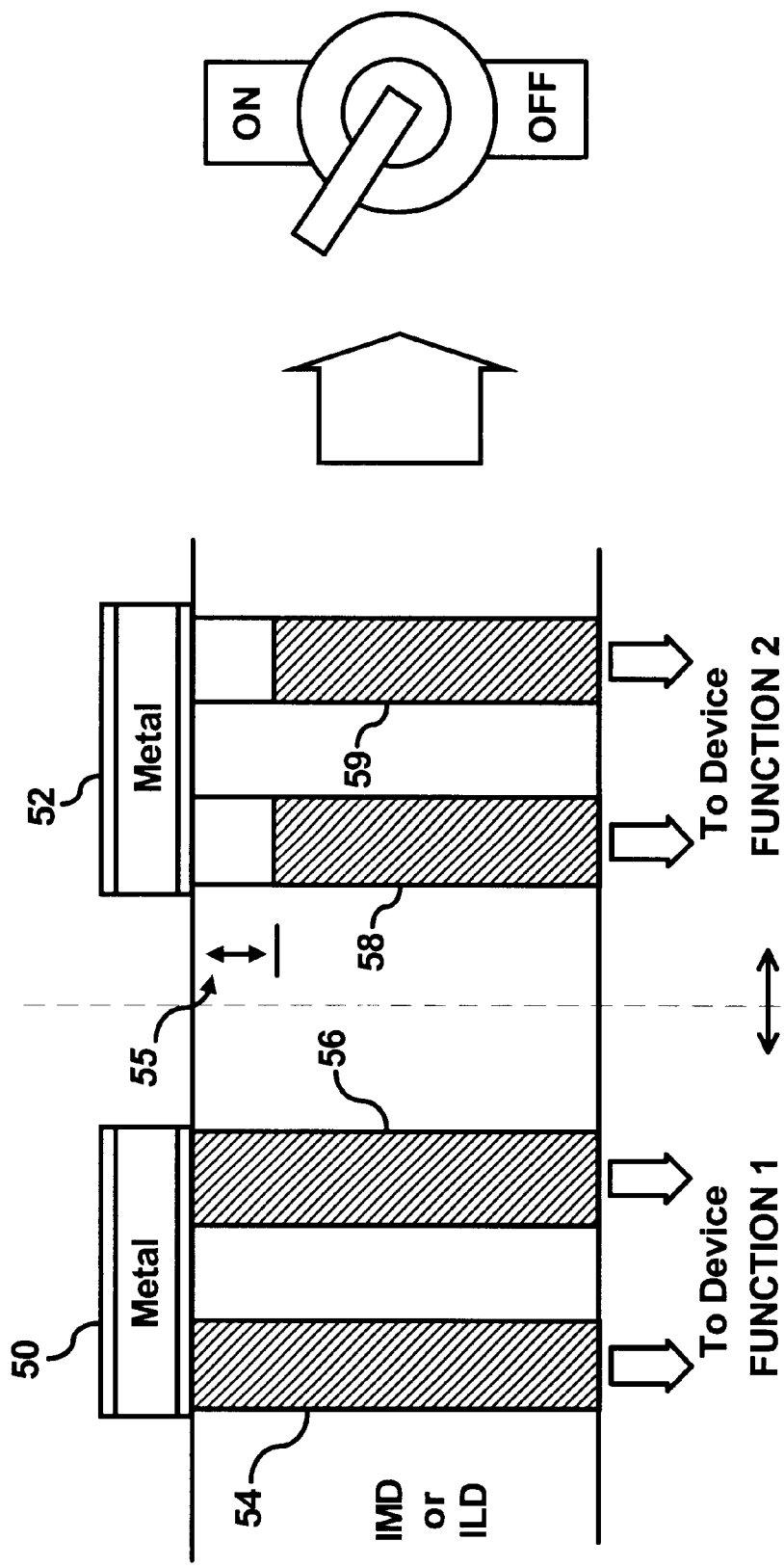
FIG. 6 illustrates the ON/OFF features of a function switch, in accordance with a preferred embodiment of the present invention.

FIG. 6 illustrates the ON/OFF features of a function switch, in accordance with a preferred embodiment of the present invention. Filler structures 54, 56, 58 and 59 are generally positioned below metal layers 30 and 32. A deformation 55 is also indicated in FIG. 5 with respect to filler structures 58 and 59. Such filler structures thus comprise fillers, which may be configured from physically sensitive material, such as SMA. The contact filler may be deformed, as indicated at reference numeral 55 due to different temperature settings. Thus, the configuration illustrated in FIG. 6 permits an associated semiconductor chip, such, as for example, semiconductor chips 20 or 22 of FIGS. 2 and 3 to act as a function switch. While temperature sensing may comprise one particular function, those skilled in the art can appreciate that other functions may be also be implemented in accordance with one or more embodiments of the present invention. The configuration illustrated in FIG. 6 can thus act as an ON/OFF function switch.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalent in all respects.

What is claimed is:

1. A method for implementing a variable sensor function circuit within a single semiconductor chip, said method comprising the step of:

configuring a semiconductor chip as a single circuit that provides varying sensor functions according to extrinsic environmental conditions;

permitting said single circuit to be switched between a particular sensor function and a different particular sensor function, thereby promoting a decreased complexity in circuit design and a decrease in physical dimensions necessary to manufacture said semiconductor chip, designating at least one portion of said semiconductor chin to said particular sensor function and at least one other portion of said semiconductor chip to said different particular sensor function, and wherein said semiconductor chip comprises a function switch for switching between at least two sensor functions.

2. The method of claim 1 wherein said particular sensor function is based on a particular extrinsic condition.

3. The method of claim 2 wherein said different particular sensor function is based on a different extrinsic condition.

4. The method of claim 1 wherein said particular sensor function Is based on a particular extrinsic condition comprising temperature.

5. The method of claim 1 further comprising the step of:
configuring said semiconductor chip to comprise a via/contact configuration comprising based on a physically sensitive material.

6. The method of claim 5 wherein said physically sensitive material comprises a shape memory alloy.

7. The method of claim 1 further comprising the step of:
designating at least one deformation within said semiconductor chip according to varying extrinsic conditions; and connecting said at least one deformation to a particular function.

8. A system for implementing a variable function circuit within a single semiconductor chip, said system comprising:
a semiconductor chip configured as a single circuit that provides varying sensor functions according to extrinsic environmental conditions; and wherein said single circuit switchable between a particular sensor function and a different particular sensor function, at least one portion of said semiconductor chip is designated to said particular sensor function and at least one other portion of said semiconductor chip to said different particular sensor function, thereby promoting a decreased complexity in circuit design and a decrease in physical dimensions necessary to manufacture said semiconductor chip.

9. The system of claim 8 wherein said particular sensor function is based on a particular extrinsic environmental condition.

10. The system of claim 9 wherein said different particular sensor function is based on a different extrinsic environmental condition.

11. The system of claim 8 wherein said particular sensor function is based on a particular extrinsic environmental condition comprising temperature.

12. The system of claim 8 wherein said semiconductor chip is configured to comprise a via/contact configuration comprising based on a physically sensitive material.

13. The system of claim 12 wherein said physically sensitive material comprises a shape memory alloy.

14. The system of claim 8 further comprising:
at least one deformation designated within said semiconductor chip according to varying extrinsic environmental conditions; and wherein said at least one deformation is connected to a particular sensor function.

15. The system of claim 8 wherein said semiconductor chip comprises a function switch for switching between at least two sensor functions.

16. A system for implementing a variable function circuit within a single semiconductor chip, said system comprising:
a semiconductor chip configured as a single circuit that provides varying sensor functions according to extrinsic conditions, wherein said single circuit is permitted to be switched between a particular sensor function and a different particular sensor function; and at least one portion of said semiconductor chip designated to said particular sensor function and at least one other portion of said semiconductor chip to said different particular sensor function, thereby promoting a decreased complexity in circuit design and a decrease in physical dimensions necessary to manufacture said semiconductor chip, such that said semiconductor chip comprises a function switch.

17. A method for implementing a variable sensor function circuit within a single semiconductor chip, said method comprising the step of:
configuring a semiconductor chip as a single circuit that provides varying sensor functions according to extrinsic environmental conditions;

permitting said single circuit to be switched between a particular sensor function and a different particular sensor function, thereby promoting a decreased complexity in circuit design and a decrease in physical dimensions necessary to manufacture said semiconductor chip, wherein said particular sensor function is based on a particular extrinsic condition comprising a magnetic field, and wherein said semiconductor chip comprises a function switch for switching between at least two sensor functions.

18. A system for implementing a variable function circuit within a single semiconductor chip, said system comprising:
a semiconductor chip configured as a single circuit that provides varying sensor functions according to extrinsic environmental conditions; and wherein said single circuit switchable between a particular sensor function and a different particular sensor function, said particular sensor function is based on a particular extrinsic environmental condition comprising a magnetic field, thereby promoting a decreased complexity in circuit design and a decrease in physical dimensions necessary to manufacture said semiconductor chip.

* * * * *